(12) United States Patent
Inagaki et al.

(10) Patent No.: US 10,395,975 B2
(45) Date of Patent: Aug. 27, 2019

(54) SEMICONDUCTOR DEVICE AND MANUFACTURING METHOD FOR THE SAME

(71) Applicant: DENSO CORPORATION, Kariya, Aichi-pref. (JP)

(72) Inventors: Yuuki Inagaki, Nagoya (JP); Kazushi Asami, Okazaki (JP); Yasuhiro Kitamura, Chiryu (JP)

(73) Assignee: DENSO CORPORATION, Kariya (JP)

( * ) Notice: Subject to any disclaimer, the term of this patent is extended or adjusted under 35 U.S.C. 154(b) by 46 days.

(21) Appl. No.: 14/644,283

(22) Filed: Mar. 11, 2015

(65) Prior Publication Data

US 2015/0270339 A1 Sep. 24, 2015

(30) Foreign Application Priority Data

Mar. 18, 2014 (JP) .................................. 2014-54902

(51) Int. Cl.
| | |
|---|---|
| *H01L 29/51* | (2006.01) |
| *H01L 21/764* | (2006.01) |
| *H01L 23/48* | (2006.01) |
| *H01L 27/02* | (2006.01) |
| *H01L 21/8249* | (2006.01) |
| *H01L 21/84* | (2006.01) |
| *H01L 23/00* | (2006.01) |
| *H01L 21/768* | (2006.01) |

(52) U.S. Cl.
CPC ...... *H01L 21/764* (2013.01); *H01L 21/76898* (2013.01); *H01L 21/8249* (2013.01); *H01L 21/84* (2013.01); *H01L 23/481* (2013.01); *H01L 24/83* (2013.01); *H01L 27/0207* (2013.01); *H01L 21/7682* (2013.01); *H01L 2224/83001* (2013.01); *H01L 2924/13091* (2013.01)

(58) Field of Classification Search
CPC ............ H01L 29/0649; H01L 29/4991; H01L 29/515
See application file for complete search history.

(56) References Cited

U.S. PATENT DOCUMENTS

| | | | |
|---|---|---|---|
| 6,406,975 B1 | 6/2002 | Lim et al. | |
| 2008/0135932 A1 | 6/2008 | Ozeki et al. | |
| 2012/0013022 A1* | 1/2012 | Sabuncuoglu Tezcan ................... | |
| | | | H01L 21/7682 |
| | | | 257/774 |
| 2012/0292782 A1* | 11/2012 | Lee ....................... H01L 23/481 | |
| | | | 257/774 |
| 2013/0009272 A1 | 1/2013 | Sakurai et al. | |

(Continued)

FOREIGN PATENT DOCUMENTS

JP 2001-127149 A 5/2001

*Primary Examiner* — Jae Lee
(74) *Attorney, Agent, or Firm* — Posz Law Group, PLC (57) ABSTRACT

A semiconductor device has a semiconductor substrate where a plurality of elements or penetration electrodes are arranged and a trench is arranged to insulate and separate the plurality of elements or penetrating elements by surrounding the plurality of elements or penetration electrodes. The trench is arranged to penetrate both sides of the semiconductor substrate, and has an inner part where a space is arranged. Accordingly, it is possible to configure a semiconductor device having a structure to suppress insulation breakdown while simplifying a manufacturing process and improving yield of product manufacture.

19 Claims, 5 Drawing Sheets

(56) References Cited

U.S. PATENT DOCUMENTS

2013/0052794 A1* 2/2013 Bang ................ H01L 21/76898
                                                    438/424
2013/0248970 A1   9/2013 Kai et al.
2014/0202635 A1* 7/2014 Yamaguchi ....... H01J 37/32733
                                                    156/345.51

* cited by examiner

P: PRESSURE IN GAP

FIG. 6

SEMICONDUCTOR DEVICE AND MANUFACTURING METHOD FOR THE SAME

CROSS REFERENCE TO RELATED APPLICATIONS

This application is based on Japanese Patent Application No. 2014-54902 filed on Mar. 18, 2014, the disclosure of which is incorporated herein by reference.

TECHNICAL FIELD

The present disclosure relates to a semiconductor device in which elements are insulated and separated by a trench, and a manufacturing method for the semiconductor device.

BACKGROUND

Patent Document 1 discloses a conventional method for forming an insulating separation structure at lower cost without using an SOI (Silicon on Insulator) substrate for a semiconductor device including a composite integrated circuit (hereinafter referred to as a composite IC). In particular, the following describes the method stated in Patent Document 1 for manufacturing a semiconductor device.

Initially, a trench for surrounding elements and each of the elements on one surface of a silicon substrate is formed. Next, a trench separation structure is configured by forming an insulation film through, for example, thermal oxidation to cover an inner wall surface of the trench, and forming a Poly-Si layer on the insulation film to embed the trench. Subsequently, a support substrate is bonded on a front surface of the silicon substrate, and then the insulation film is exposed by grinding a rear surface of the silicon substrate to a bottom surface of the trench. A region formed by various elements is surrounded by a trench separation structure and the insulation layer on the rear surface of the silicon substrate by bonding a support body on the rear surface of the silicon substrate through the insulation layer. Thus, it is possible to attain an insulating separation structure between elements without using an SOI substrate, and produce the insulating separation structure at lower cost.

However, insulation breakdown and lower yield of product manufacture are caused by insufficient film thickness of the insulation film formed on the inner wall of the trench. In addition, manufacturing cost is increased as an oxidation process for forming an insulation film or a process for embedding a Poly-Si layer is necessary, and a process for forming a trench separation structure is necessary.

[Patent Document 1] JP-2001-127149 A

SUMMARY

It is an object of the present disclosure to provide a semiconductor device including a structure for suppressing insulation breakdown and simplifying a manufacturing method and improving the yield of product manufacture, and a manufacturing method for the semiconductor device.

According to a first aspect of the present disclosure, a semiconductor device includes a semiconductor substrate where a plurality of elements or penetration electrodes are arranged and a trench is arranged to insulate and separate the plurality of elements or penetration electrodes by surrounding the plurality of elements or penetration electrodes. The trench is arranged to penetrate both sides of the semiconductor substrate, and has an inner part where a space is arranged.

In this way, without embedding a Poly-Si layer inside a trench constituting a trench separation structure, the trench is configured to be in a state where a space has been left, for example a state where gas is sealed, or alternatively in a vacuum state (i.e., decompression state). As in a case where a Poly-Si layer is embedded, it can be prevented that insulation breakdown is caused by, for example, insufficient film thickness of an insulation film when forming the insulation film on an inner wall surface of the trench. Since it is not required to carry out embedding by a Poly-Si layer, the simplification of a manufacturing method can be achieved. Moreover, since insulation between elements without arranging an insulation film can be achieved, in a case where a structure has no insulation film, it is not required to perform, for example, a thermal oxidation process so that the simplification of the manufacturing method is further achieved.

According to a second aspect, a manufacturing method for a semiconductor device includes: the preparation of a semiconductor substrate having a front surface and a rear surface, and the formation of a plurality of elements on the front surface of the semiconductor device; the formation of a trench to penetrate the semiconductor substrate from the rear surface of the semiconductor substrate after the formation of the plurality of elements; and the formation of a sealing insulation film for sealing an opening end of the trench at the rear surface of the semiconductor substrate while keeping an inner part of the trench to have a space.

Accordingly, it is possible to configure a semiconductor device having a structure for suppressing insulation breakdown while simplifying a manufacturing process and improving yield of product manufacture.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

A first embodiment of the present disclosure is described below. The present embodiment describes with an example of a semiconductor device providing CMOS and bipolar transistors as a configuration in which a plurality of elements are insulated and separated by a trench. It is noted that the specification describes an example of CMOS and bipolar transistors as elements; however, it is not restricted to CMOS and bipolar transistors. It may be a semiconductor device in which element separation is carried out on any kind of elements.

Figure 1:
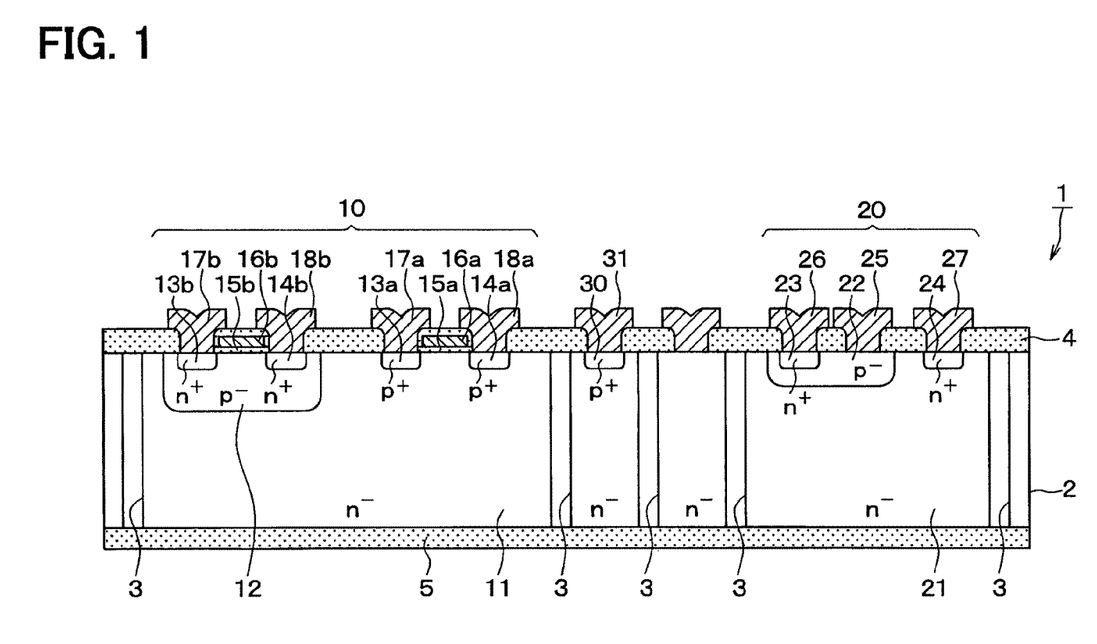
FIG. 1 is a diagram showing a cross-sectional configuration of a semiconductor device according to a first embodiment.

As shown in FIG. 1, a semiconductor device 1 according to the present embodiment is arranged by using a silicon substrate 2. The semiconductor device 1 includes, for example, a CMOS transistor 10 or a bipolar transistor 20. The CMOS transistor 10 and the bipolar transistor 20 are insulated and separated by a trench 3.

In particular, the trench 3 carries out element separation within the silicon substrate 2. One region formed by element separation is configured as an $n^-$-type well layer 11 for arranging the CMOS transistor 10, and a $p^-$-type well layer 12 is arranged within the $n^-$-type well layer 11.

A $p^+$-type source region 13a and a $p^+$-type drain region 14a are configured within the $n^-$-type well layer 11, and an $n^+$-type source region 13b and an $n^+$-type drain region 14b are configured within the $p^-$-well layer 12. Gate electrodes 16a, 16b are arranged on the surface of the $n^-$-type well layer 11 located between the $p^+$-type source region 13a and the $p^+$-type drain region 14a and on the surface of $p^-$-well layer 12 located between the $p^-$-type source region 13b and the $n^+$-type drain region 14b, through the gate insulation films 15a, 15b.

A source electrode 17a or a drain electrode 18a, which is electrically connected to the $p^+$-type source region 13a or the $p^+$-type drain region 14a, is formed through an interlayer insulation film 4 on the $n^-$-type well layer 11 or the like. Moreover, a source electrode 17b or a drain electrode 18b, which is electrically connected to the $n^+$-type source region 13b or the $n^+$-type drain region 14b, is arranged through the interlayer insulation film 4 on the $p^-$-type well layer 12 or the like.

Therefore, the CMOS transistor 10 is configured with an n-channel MOSFET and a p-channel MOSFET.

On the other hand, one another region formed by element separation through the trench 3 within the silicon substrate 2 is configured as an $n^-$-type well layer 21 for arranging the bipolar transistor 20.

An NPN transistor as the bipolar transistor 20 is arranged within the $n^-$-type well layer 21. In particular, a p-type base region 22 is arranged in the surface portion of the $n^-$-type well layer 21, and an $n^+$-type emitter region 23 is arranged in the surface portion of the p-type base region 22. Additionally, an $n^+$-type collector region 24 is arranged on a location spaced apart from the p-type base region 22. A base electrode 25, an emitter electrode 26 and a collector electrode 27 are provided through the interlayer insulation film 4. The base electrode 25, the emitter electrode 26 and the collector electrode 27 are electrically connected to the p-type base region 22, the $n^+$-type emitter region 23 and the $n^+$-type collector region 24 respectively through a contact hole arranged in the interlayer insulation film 4.

The bipolar transistor 20 configured by an NPN transistor is arranged. It is noted that this specification provides an example of an NPN transistor; however, a PNP transistor may be arranged as well.

Thus, the CMOS transistor 10 and the bipolar transistor 20 are arranged. In addition, the components other than the CMOS transistor 10 or the bipolar transistor 20 are arranged in the semiconductor device 1. For example, a $p^+$-type diffusion layer 30 is arranged on the surface portion of the silicon substrate 2, and a fixed-potential electrode 31, which is electrically connected to the $p^+$-type diffusion layer 30, is also arranged. According to the configuration, an outer peripheral withstand voltage structure is arranged. The semiconductor device 1 is configured by the arrangement of, for example, a variety of elements in addition to the CMOS transistor 10 or the bipolar transistor 20 on the silicon substrate 2.

Thus, the semiconductor device 1 including, for example, the CMOS transistor 10 and the bipolar transistor 20 is arranged, and the trench 3 penetrating the silicon substrate 2 is arranged to insulate and separate each of the elements such as the CMOS transistor 10 or the bipolar transistor 20. The upper layout of the trench 3 is arranged into a hexagonal shape as shown in, for example, FIG. 2A, and the upper layout is arranged to surround each of the elements. Each of the regions surrounded by the trench 3 is electrically separated.

The trench 3 has an inner part where a space is arranged, and insulates and separates a region where each of the elements is arranged by making gas such as air sealed or making the inner pressure to be in a vacuum state (i.e., a decompression state), which is equal or less than 100 Pa. The side wall surface of the trench 3 is structured as a silicon surface in a state where the surface of the silicon substrate 2 is exposed. Or alternatively, the inner wall surface of the trench 3 is covered by an insulation film such as a silicon oxide ($SiO_2$) film or a silicon nitride (SiN) film. According to this configuration, it is possible to prevent insulation breakdown, which is easily generated by influence of electrons between opposite metal layers in a case of placing a metal layer on the inner wall surface of the trench 3.

In the present embodiment, both ends of the trench 3, that is, both opening ends located at the front and rear surfaces of the silicon substrate 2 are hermetically sealed by material different from the silicon substrate 2. In particular, the opening end of the trench 3 at the front surface side of the silicon substrate 2 is hermetically sealed by the interlayer insulation film 4, and the opening end of the trench 3 at the rear surface side of the silicon substrate 2 is covered by the sealing insulation film 5.

The semiconductor device 1 according to the present embodiment is configured by the above structure. The semiconductor device 1 made as above is configured not to embed a Poly-Si layer in the trench 3 constituting a trench separation structure so that the trench 3 is in a state where a space remains, for example, a state in which gas is sealed or a vacuum state (i.e., a decompression state).

For this reason, as in the case of embedding a Poly-Si layer, insulation breakdown caused by insufficient film thickness of an insulation film is prevented when the insulation film is arranged on the inner wall surface of the trench 3. Since it is not required to carry out embedding a Poly-Si layer, it is possible to simplify a manufacturing process. Moreover, since it is possible to achieve insulation between elements without arranging an insulation film, as in a case of a structure without an insulation film, it is not required to carry out, for example, a thermal oxidation process. Thus, the simplification of a manufacturing process is further achieved.

Next, a manufacturing method for the semiconductor device 1 with regard to the present embodiment configured above is described with reference to FIG. 3A through FIG. 4C.

Figure 3A:
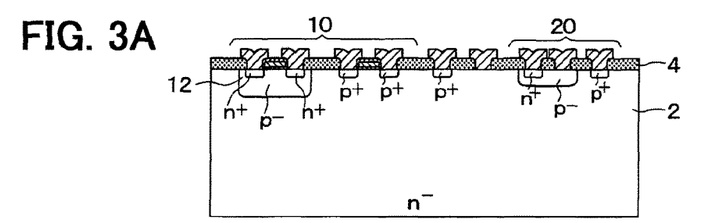
FIGS. 3A through 3D are cross-sectional diagrams that illustrate a process for manufacturing the semiconductor device illustrated in FIG. 1.

[Process Shown in FIG. 3A]

Through an ordinary semiconductor process such as ion injection of impurities by using a mask or thermal diffusion, film formation for electrode material constituting the interlayer insulation film 4 or a variety of electrodes and patterning, the CMOS transistor 10, the bipolar transistor 20 or the like is formed on the silicon substrate 2. At this time, an alignment mark is added to a desired position at the front surface side of the silicon substrate 2 such as a part different from a location where elements are formed, and a semiconductor process is carried out based on, for example, mask matching with reference to the alignment mark. Since a semiconductor process for forming the elements or the like has been known, the detailed description is omitted.

Figure 3B:
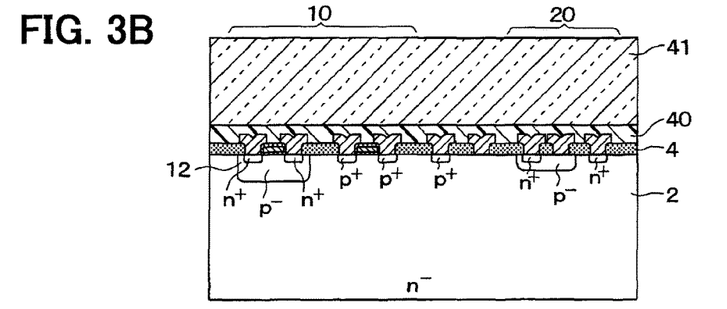

[Process Shown in FIG. 3B]

A glass-support substrate 41 is bonded via an adhesive layer 40 on the front surface side of the silicon substrate 2 after the formation of elements or the like, that is, the front surface at the side where elements are formed. The adhesive layer 40 is configured by, for example, a UV resin layer and a laser peeling layer.

Figure 3C:
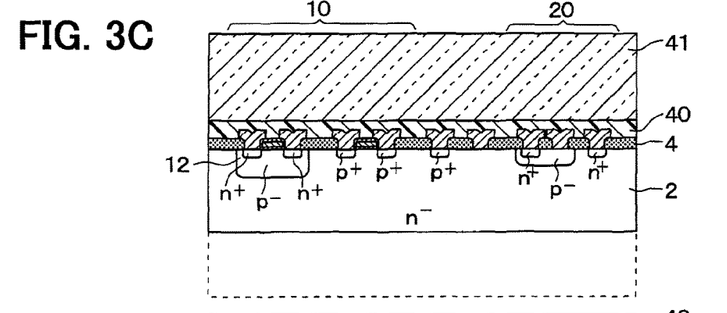

[Process Shown in FIG. 3C]

When the glass-support substrate 41 is bonded via the adhesive layer 40 on the silicon substrate 2 after the formation of elements or the like, the silicon substrate 2 is ground and polished from the rear surface side, and the silicon substrate 2 is processed to a predetermined thickness.

Figure 3D:
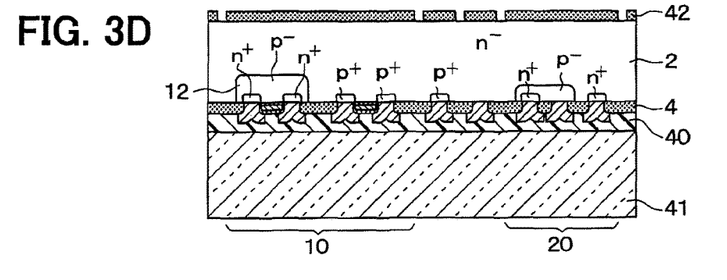

[Process Shown in FIG. 3D]

Mask material 42 is disposed on the rear surface of the silicon substrate 2 with a predetermined thickness, and the mask material 42 is removed in the region where the trench 3 is formed by patterning the mask member 42. At this time, it is possible to perform patterning of the mask material 42 on the front surface side of the silicon substrate 2 substantially without misalignment.

Figure 4A:
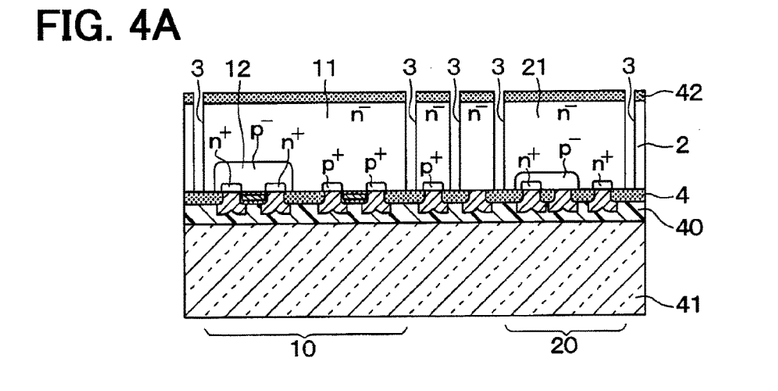
FIGS. 4A through 4C are cross-sectional diagrams that illustrate steps for manufacturing the semiconductor device following the steps in FIG. 3.

[Process Shown in FIG. 4A]

The trench 3 is formed by performing anisotropic etching (for example, RIE (Reactive Ion Etching)) in a state where the rear surface side of the silicon substrate 2 is covered by the mask material 42. At this time, the trench 3 is configured so as to penetrate to the rear surface side of the silicon substrate 2; however, the tip of the trench 3 is terminated at the position where the interlayer insulation film 4 is formed. Accordingly, the structure having the trench 3 formed with the interlayer insulation film 4 as an etching stopper and the tip of the trench 3 at the front surface side of the silicon substrate 2 hermetically sealed by the interlayer insulation film 4 can be achieved.

Figure 4B:
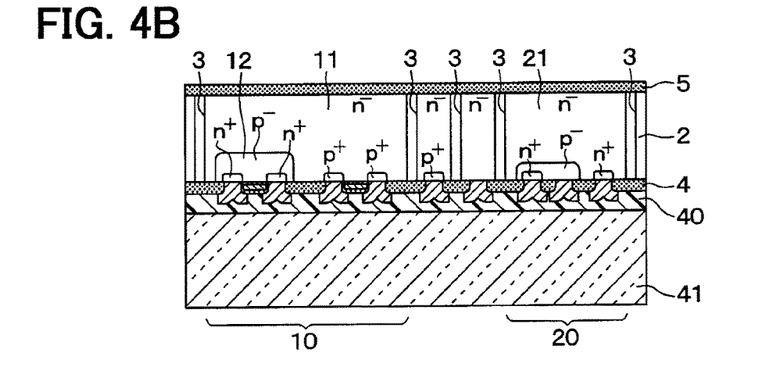

[Process Shown in FIG. 4B]

After the formation of the trench 3, the sealing insulation film 5 is formed after removing the mask material 42 formed on the rear surface side of the silicon substrate 2. For example, the sealing insulation film 5 made of, for example, TEOS (Tetra Ethyl Ortho Silicate) is formed by plasma CVD or the like. When the sealing insulation film 5 is formed by plasma CVD, it is possible to configure the trench 3 to be in a vacuum state (i.e., a decompression state) where the inner pressure is equal to or less than 100 Pa. In addition, when the sealing insulation film 5 made of TEOS is formed by plasma CVD, the inner part of the trench 3 is configured to be in a decompression state and a state in which, for example, $O_2$, $CO_2$ and $H_2O$ are sealed in the trench 3.

Figure 5:
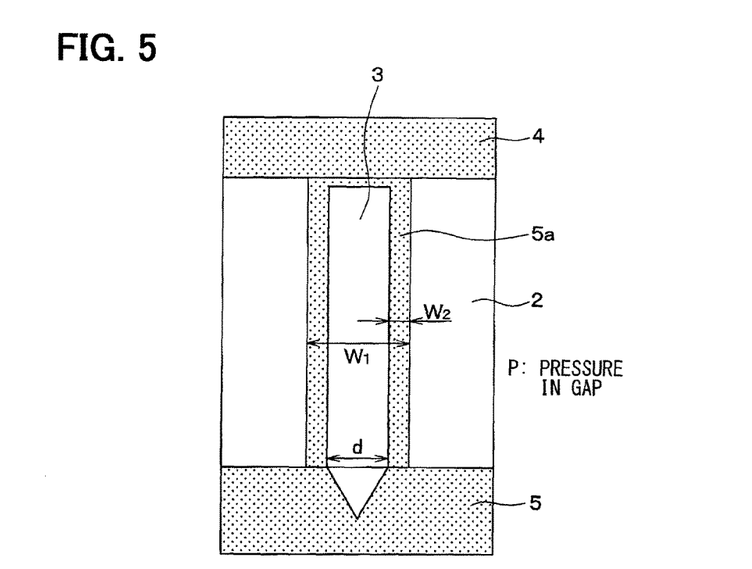
FIG. 5 is an enlarging cross-sectional diagram showing the proximity of the trench when an insulation film for sealing is formed by plasma CVD.

Moreover, when plasma CVD is carried out, a side wall insulation film 5 with a predetermined film thickness is formed on the inner wall surface of the trench 3 as shown in FIG. 5. The deposition thickness of the sealing insulation film 5 is arbitrary; however, according to the experiment, the opening at the tip side of the trench 3 can be firmly closed when the deposition thickness is 1 μm thicker than the opening width of the trench 3. The deposition thickness through CVD gets slimmer from the rear surface of the silicon substrate 2 to the side wall of the trench 3. Thus, the opening end of the trench 3 is closed before the inner part of the trench 3 is embedded by the side wall insulation film 5a, and the inner part of the trench 3 is not embedded by the side wall insulation film 5a. In other words, by considering the opening width W of the trench 3 and the thickness W2 of the side wall insulation film 5a, the trench 3 can be configured not to be firmly embedded by the side wall insulation film 5a by means of selecting deposition condition for plasma CVD to satisfy an expression of $W1-2 \times W2 > 0$.

Accordingly, it is possible to configure a structure in which the tip of the trench 3 at the rear surface side of the silicon substrate 2 is also hermetically sealed by the sealing insulation film 5. It is noted that the sealing insulation film 5 may be formed by a technique other than plasma CVD. In this case, it is possible to control the type of gas sealed into the trench 3 or inner pressure of the trench 3 based on the adjustment of ambient atmosphere or atmospheric pressure at the time of forming the sealing insulation film 5. For example, when the ambient atmosphere or atmospheric pressure is adjusted to air atmosphere, air can be sealed into the trench 3 and the inner pressure of the trench 3 can be configured into atmospheric pressure. In addition, when the ambient atmosphere or atmospheric pressure is adjusted to decompression atmosphere, the pressure within the trench 3 can be properly adjusted. For example, when the ambient atmosphere or atmospheric pressure is adjusted to decompression atmosphere equal to or less than 100 Pa, the inner pressure of the trench 3 can be adjusted to a vacuum state (i.e., decompression state), which is equal to or less than 100 Pa.

Figure 4C:
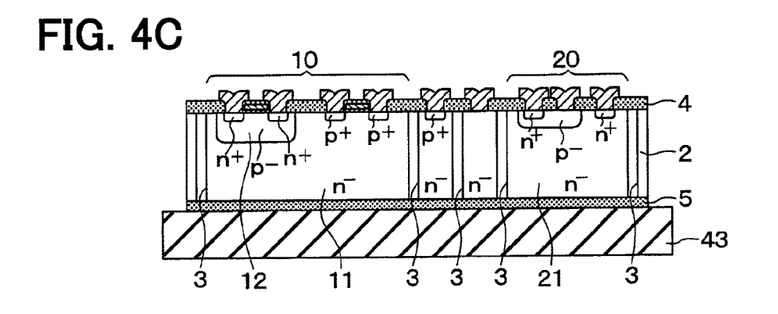

[Process Shown in FIG. 4C]

After bonding dicing tape 43 on the sealing insulation film 5 formed at the rear surface side of the silicon substrate 2, laser irradiation is performed on the front surface side of the silicon substrate 2. Accordingly, laser is irradiated on an adhesive layer 40 through the glass-support substrate 41, and the glass-support substrate 41 is peeled off from the adhesive layer 40. After peeling tape (not shown) is bonded on the adhesive layer 40, when the peeling tape is peeled off, it is possible to remove the adhesive layer 40 from the front surface side of the silicon substrate 2 by peeling off the adhesive layer 40 bonded on the peeling tape.

Subsequently, the silicon substrate 2 on which, for example, elements are formed by using dicing tape or the like is divided into chip units, and the semiconductor device 1 with regard to the present embodiment is completed by peeling off the dicing tape 43 from the sealing insulation film 5. For example, the semiconductor device 1 is peeled off from the dicing tape 43 by pressing the semiconductor device 1 on the dicing tape 43 through pin provided from the side opposite to the semiconductor device 1 with the dicing tape 43 being interposed.

As described above, the semiconductor device 1 with regard to the present embodiment is configured to make the inner part of the trench 3 constituting a trench separation structure to be in a state where gas is sealed without embedding a Poly-Si layer, or a vacuum state (i.e., decompression state). Therefore, it can be prevented that insulation breakdown is caused by, for example, insufficient film thickness of the insulation film formed on the inner wall surface of the trench 3. Thus, it is possible to improve yield of product manufacture. In addition, the simplification of manufacturing process without a process of embedding a Poly-Si layer is achieved. Furthermore, the simplification of manufacturing process is achieved without a thermal oxidation process when the side wall insulation film 5a is not arranged on the inner wall surface of the trench 3.

When the side wall insulation film 5a is arranged, even if conductive foreign substance is supposed to enter the trench 3, it is also possible to suppress insulation breakdown caused by contamination of foreign substance because the insulation caused by the side wall insulation film 5a is ensured.

Moreover, when the inner pressure of the trench 3 is set to be equal to or less than 100 Pa, it is possible to improve withstand voltage. That is, as the curve line indicative of the relationship between voltage caused by electric discharge (i.e., spark voltage) and gaseous pressure based on the Paschen's law indicated in FIG. 6 is shown, when gas is sealed in the trench 3, a high withstand voltage is attained such that the inner pressure P of the trench 3 and the maximum width W of the trench 3 satisfy the following formula.

$$P \cdot d (\text{cm} \cdot \text{Torr}) < 0.4 \quad \text{(Formula 1)}$$

Based on the Formula 1, in a case where, for example, the opening width of the trench 3 is fixed to be about 2 to 3 μm, it can be said that a high withstand voltage is attained when the inner pressure of the trench 3 is equal to or less than 1.5 kPa. Accordingly, it is possible to attain a higher withstand voltage by configuring the opening width of the trench 3 to be 2 to 3 μm and the inner pressure of the trench 3 to be equal to or less than 1.5 kPa. The maximum width d of the trench 3 is a part where the width becomes greatest within the trench 3 formed to surround an element forming region. When the trench 3 is arranged in a hexagonal shape as shown in FIG. 2A, the hexagon has apexes that are arranged to form the maximum width.

Figure 6:
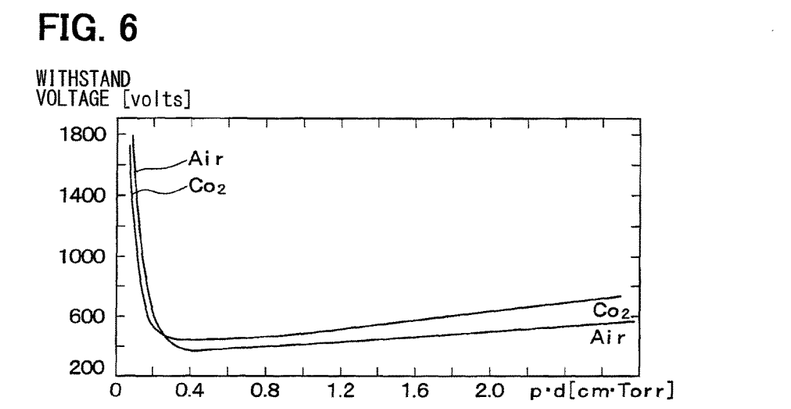
FIG. 6 is a diagram showing high withstand-voltage characteristics based on the Paschen's law.

Even if gas other than air such as $CO_2$ is sealed in the trench 3, as shown in FIG. 6, the opening width of the trench 3 or the inner pressure of the trench 3 may be set to satisfy the formula 1 as similar to the case of air. The curve line based on the Paschen's law is arranged to be substantially similar to the case of other gas, $O_2$, $H_2O$ or the like; however, it is possible to attain a higher withstand voltage when $O_2$, $CO_2$, $H_2O$ or the like is sealed. With regard to these types of gas, only one of these types of gas may be sealed in the trench 3. Alternatively, a plurality of types of gas may be sealed.

Accordingly, when the opening width of the trench 3 is fixed to about 2 to 3 μm, it is possible to attain a higher withstand voltage by configuring the inner pressure of the trench 3 to be equal to or less than 1.5 kPa while sealing gas in the trench 3.

Figure 2A:
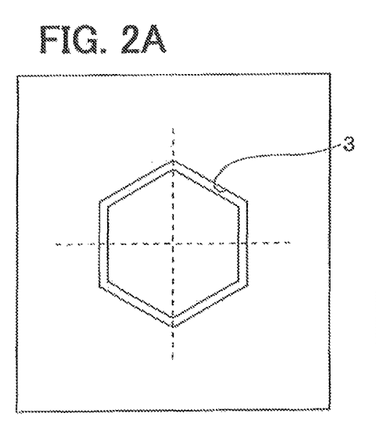
FIGS. 2A through 2D are diagrams showing an upper layout of a trench.

Moreover, an upper layout of the trench 3 is arranged in a hexagonal shape in the present embodiment; however, the upper layout is configured in a hexagonal shape arranged in a line symmetrical with respect to any of symmetrical lines, as two vertically and horizontally symmetrical broken lines shown in FIG. 2A, that is, two orthogonal broken lines shown in the figure are set as symmetrical lines. When the upper layout is configured in such shape, it can be prevented that tilting of an island constituting an element forming region within the silicon substrate 2 is caused by making inside of the trench 3 hollow. In other words, two side surfaces of the trench 3 are arranged as wall surfaces opposite to each other so that an electrostatic attraction force may be generated. In this case, when the upper layout of the trench 3 is vertically or horizontally asymmetrical in FIG. 2A, it is possible that the island constituting an element forming region may be tilted due to the imbalance of the electrostatic attraction force. Accordingly, when the trench 3 is configured in a hexagonal shape to be vertically and horizontally symmetrical, it is possible to prevent the tilting of an island constituting an element forming region.

(Other Embodiment)

For example, the above configuration is configured to block the tip of the trench 3 at both sides of the front and rear surfaces on the silicon substrate 2 in view of an increase in mechanical strength of the semiconductor device 1; however, it may be configured such that only one side is blocked. Even in such a case, the type or inner pressure of gas sealed in the trench 3 can be properly adjusted by, for example, configuring the semiconductor device 1 to be accommodated in a casing (not shown). By hermetically sealing the casing as inside of the casing to be in a vacuum state or a state where desired gas is sealed, it is possible to configure the inner part of the trench 3 to be in a state where gas such as air is sealed, or a vacuum state (i.e., decompression state) where the inner pressure is equal to or less than 100 Pa.

It is described that the sealing insulation film 5 is arranged by plasma CVD while the side wall insulation film 5a is formed at the same time in the above embodiment. However, the sealing insulation film 5 and the side wall insulation film 5a may be arranged separately. Moreover, the sealing insulation film 5 or the side wall insulation film 5a may not only be formed as a silicon oxidation film but also a silicon nitride film or the like. The effect of preventing metal contamination may be attained in a case of being formed as a silicon nitride film.

Figure 2B:
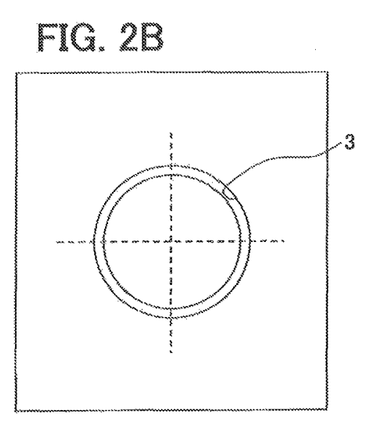
Figure 2C:
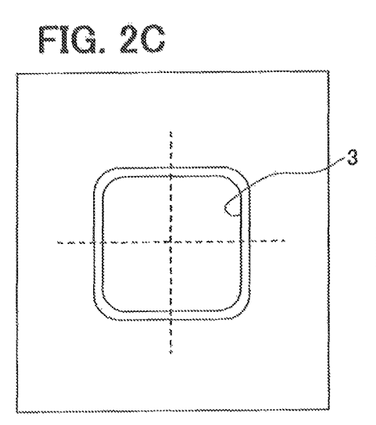
Figure 2D:
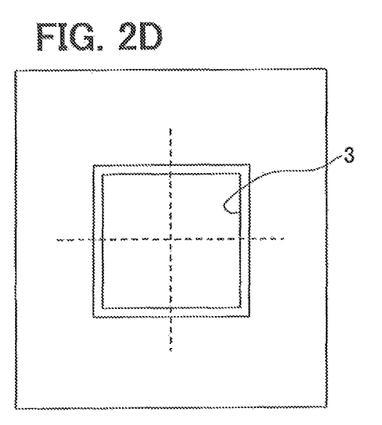

With regard to the above embodiment, the upper layout of the trench 3 is arranged in a hexagonal shape; however, the upper layout may be arranged in other shapes, such as a quadrangular shape illustrated in FIG. 2D, and the upper layout may also be formed in a shape formed by rounding corner sections of a polygonal shape illustrated in FIG. 2C, a circular shape illustrated in FIG. 2B, an oval shape or the like. In any of cases, when the upper layout is formed as a line symmetrical respectively with two orthogonal directions as symmetrical lines, it can be prevented that the tilting of an island constituting an element forming region is caused by the imbalance of an electrostatic attraction force.

In the above embodiment, the silicon substrate 2 used as a semiconductor substrate is exemplified; however, element formation on a semiconductor substrate by using semiconductor material other than silicon can also be applied in the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claim is:

1. A semiconductor device comprising:
    a semiconductor substrate made of a semiconductor material including
    a plurality of elements arranged at a front surface portion of the semiconductor substrate,
    an insulation film arranged at a rear surface portion of the semiconductor substrate, and
    a trench arranged to insulate and separate at least one of the plurality of elements by surrounding the at least one of the plurality of elements,
    wherein:
    the trench is arranged to penetrate both sides of the semiconductor substrate,
    the trench has an inner part where a hollow space is arranged, the trench has an inner wall surface of the semiconductor material, and the inner wall surface of the semiconductor material is exposed to the hollow space of the trench at both sides of the trench, the trench has an upper layout with a shape from a bird's eye view that is line-symmetrical with respect to two directions orthogonal to each other as symmetrical lines, and the at least one of the plurality of elements is surrounded and isolated by the hollow space of the trench and the insulation film and provides a separate semiconductor device that withstands insulation breakdown with other of the plurality of elements adjacent to the at least one of the plurality of elements, wherein the trench includes two side surfaces of the trench as wall surfaces opposite to each other configured to generate an electrostatic attraction force that prevents tiling of an island constituting an element forming region based on a resulting imbalance of electrostatic attraction forces.

2. The semiconductor device according to claim 1, wherein the trench has an inner part, which is in a state where gas is internally sealed or in a vacuum state.

3. The semiconductor device according to claim 2, wherein the trench has an opening width configured to be in a range between 2 μm and 3 μm, and wherein a degree of vacuum in the inner part of the trench is configured to be equal to or less than 1.5 kPa.

4. The semiconductor device according to claim 2, wherein one or a plurality of $O_2$, $CO_2$ or $H_2O$ are sealed in the inner part of the trench.

5. A semiconductor device comprising:

a semiconductor substrate including a plurality of elements at a front surface portion of the semiconductor substrate, an insulation film is arranged at a rear surface portion of the semiconductor substrate, and a trench surrounding at least one of the plurality of elements and separating and insulating the at least one of the plurality of elements from other components included within the semiconductor substrate, wherein:

the trench penetrates both surface sides of the semiconductor substrate and has an inner part containing a hollow space;

the inner part of the trench is sealed in a vacuum state;

the trench has an upper layout with a shape from a bird's eye view that is line-symmetrical with respect to two directions orthogonal to each other as symmetrical lines; and the at least one of the plurality of elements is surrounded and isolated by the hollow space of the trench and the insulation film and provides a separate semiconductor device that withstands insulation breakdown with other of the plurality of elements adjacent to the at least one of the plurality of elements, wherein the trench includes two side surfaces of the trench as wall surfaces opposite to each other configured to generate an electrostatic attraction force that prevents tiling of an island constituting an element forming region based on a resulting imbalance of electrostatic attraction forces.

6. The semiconductor device according to claim 5, wherein a side wall insulation film is arranged on the inner wall surface of the trench.

7. The semiconductor device according to claim 6, wherein, when the trench has a width set to be W1 and the side wall insulation film has a thickness set to be W2, the width of the trench and the thickness of the side wall insulation film are configured to satisfy an equation of $W1-2 \times W2 > 0$.

8. The semiconductor device according to claim 1, wherein, when the trench has an inner pressure set to be P and a maximum width set to be d, the inner pressure and the maximum width of the trench are configured to satisfy an equation of $P \cdot d < 0.4$.

9. A manufacturing method for a semiconductor device, the method comprising:

preparing a semiconductor substrate having a front surface and a rear surface, and forming the plurality of elements on the front surface side of the semiconductor device;

forming a trench to have an upper layout with a shape from a bird's eye view that is line-symmetrical with respect to two directions orthogonal to each other as symmetrical lines and to penetrate the semiconductor substrate from the rear surface of the semiconductor substrate after forming the plurality of elements;

forming a sealing insulation film for sealing only an opening end of the trench at the rear surface of the semiconductor substrate while keeping an inner part of the trench to have a hollow space, wherein the at least one of the plurality of elements is surrounded and isolated by the hollow space of the trench and the insulation film and provides a separate semiconductor device that withstands insulation breakdown with other of the plurality of elements adjacent to the at least one of the plurality of elements; and the forming of the trench includes forming two side surfaces of the trench as wall surfaces opposite to each other configured to generate an electrostatic attraction force that prevents tiling of an island constituting an element forming region based on a resulting imbalance of electrostatic attraction forces.

10. The semiconductor device according to claim 5, wherein the trench has an inner wall surface and the semiconductor substrate is exposed to the inner wall surface of the trench.

11. The semiconductor device according to claim 5, wherein:

the trench has an opening width in a range from 2 μm to 3 μm; and a degree of vacuum in the inner part of the trench is equal to or less than 1.5 kPa.

12. The semiconductor device according to claim 5, wherein the trench has an inner pressure of P and a maximum width of d, and the inner pressure and the maximum width of the trench satisfy an equation of $P \cdot d < 0.4$.

13. The semiconductor device according to claim 1, wherein:

the trench has an inner part maintained in a vacuum state or in a state where gas is internally sealed, and the trench has an inner pressure of P and a maximum width of d, and the inner pressure and the maximum width of the trench satisfy an equation of $P \cdot d < 0.4$.

14. The semiconductor device according to claim 5, wherein the trench has an inner wall surface of the semiconductor material, and the inner wall surface of the semiconductor material is exposed to the hollow space of the trench at both sides of the trench.

15. The semiconductor device according to claim 1, wherein:
the inner wall surface of the semiconductor material is entirely exposed to the hollow space of the trench at the both sides of the trench.

16. A semiconductor device comprising:
a semiconductor substrate where
a plurality of elements arranged on a front surface portion of the semiconductor substrate,
a trench is arranged to insulate and separate at least one of the plurality of elements by surrounding the at least one of the plurality of elements, and
wherein:
the trench is arranged to penetrate both sides of the semiconductor substrate, the trench has an inner part where a hollow space is arranged, and
wherein, when the trench has an inner pressure set to be P and a maximum width set to be d, the inner pressure and the maximum width of the trench are configured to satisfy an equation of $P \cdot d < 0.4$, and
wherein the trench includes two side surfaces of the trench as wall surfaces opposite to each other configured to generate an electrostatic attraction force that prevents tiling of an island constituting an element forming region based on a resulting imbalance of electrostatic attraction forces.

17. The semiconductor device according to claim 8, wherein
wherein, the inner pressure P is measured in pascals and the maximum width is measured in centimeters and the equation is: $P \cdot d < 0.4$ (cm·Torr).

18. The semiconductor device according to claim 12, wherein
wherein, the inner pressure P is measured in pascals and the maximum width is measured in centimeters and the equation is: $P \cdot d < 0.4$ (cm·Torr).

19. The semiconductor device according to claim 16, wherein wherein, the inner pressure P is measured in pascals and the maximum width is measured in centimeters and the equation is: $P \cdot d < 0.4$ (cm·Torr).

* * * * *